United States Patent [19]

Okada

[11] Patent Number: 4,740,715

[45] Date of Patent: Apr. 26, 1988

[54] SELF SUBSTRATE BIAS GENERATOR FORMED IN A WELL

[75] Inventor: Yoshio Okada, Tokyo, Japan

[73] Assignee: Kabushiki Kaisha Toshiba, Kawasaki, Japan

[21] Appl. No.: 907,803

[22] Filed: Sep. 16, 1986

[30] Foreign Application Priority Data

Sep. 19, 1985 [JP] Japan .............................. 60-206981

[51] Int. Cl.[4] ........................ H03K 3/01; H03K 19/20

[52] U.S. Cl. ............................ 307/296 R; 307/200 B; 307/297; 307/445

[58] Field of Search .................. 307/445, 297, 296 R, 307/200 B; 357/48

[56] References Cited

U.S. PATENT DOCUMENTS 4,283,642 8/1981 Green ................................ 307/297
4,307,333 12/1981 Hargrove ........................... 307/297

FOREIGN PATENT DOCUMENTS 62894 4/1981 European Pat. Off. .
84177 12/1982 European Pat. Off. .
143157 6/1984 European Pat. Off. .
2420877 3/1979 France .

*Primary Examiner*—John Zazworsky
*Assistant Examiner*—M. R. Wambach
*Attorney, Agent, or Firm*—Finnegan, Henderson, Farabow, Garrett & Dunner

[57] ABSTRACT

The invention relates to a self substrate bias generator. A well is formed in a semiconductor substrate. The first capacitor is connected between the terminal to which the first clock signal is supplied and the first node. The second capacitor is connected between the terminal to which the second clock signal, which has an opposite phase to the first signal, is supplied and the second node. The first to fourth transistors are formed in the well. For the first transistor, a current path is connected between the substrate and the first node and its gate is connected to the first node. For the second transistor, a current path is connected between the substrate and the second node and its gate is connected to the second node. For the third transistor, a current path is connected between a predetermined potential and the first node and its gate is connected to the second node. For the fourth transistor, a current path is connected between the predetermined potential and the second node and its gate is connected to the first node. If the substrate is of the P type, the charges are pumped from the substrate to the predetermined potential by the generator. In the case of the N-type substrate, the charges are pumped from the predetermined potential into the substrate.

11 Claims, 2 Drawing Sheets

SELF SUBSTRATE BIAS GENERATOR FORMED IN A WELL

BACKGROUND OF THE INVENTION

The present invention relates to a self substrate bias generator and, more particularly, to a self substrate bias generator for use in a large scale integrated circuit.

A self substrate bias generator for maintaining the potential of a P-type semiconductor substrate to a predetermined potential below the earth potential (VSS) which is applied to the circuit formed on the semiconductor substrate is known. This substrate voltage generator is formed as shown in, for example, FIG. 1A. In FIG. 1A, an output terminal of an oscillator 1 is connected through a capacitor C1 to the gate of a transistor T1, to one end of the current path of transistor T1, and to the cathode of a diode D1. The output terminal of oscillator 1 is also connected through an inverter 2 and a capacitor C2 to the gate of a transistor T2, to one end of the current path of transistor T2, and to the cathode of a diode D2. The earth potential (VSS) of the circuit formed on this substrate is supplied to the other ends of the current paths of transistors T1 and T2. The anodes of diodes D1 and D2 are connected to the semiconductor substrate. As diodes D1 and D2 in the circuit shown in FIG. 1A, the PN junctions between N+ (N-type high concentration) layers serving as the drains of transistors T1 and T2 and a P-type semiconductor substrate (P-SUB) are generally used as shown in a cross sectional view of FIG. 1B.

The potential of nodes Qi (i=1 or 2) shown in FIG. 1A becomes an L level in response to a clock signal from oscillator 1 and the potential of a node Pi shown in FIG. 1A is reduced through capacitor Ci. When the potential of node Pi decreases, diode Di is turned on and the charges in the semiconductor substrate are pumped to node Pi. When the potential of node Pi becomes an H level, the charges pumped to node Pi are pumped to earth potential VSS by transistor Ti. Potential VBB of the semiconductor substrate is maintained to below earth potential VSS by the above series of operations. To efficiently use oscillator 1, two sets, each consisting of capacitors C1, C2, diodes D1, D2, and transistors T1, T2, respectively, are used. Each set operates independently.

The foregoing circuit has the following two drawbacks:

(1) The first drawback relates to transistor Ti. When transistor Ti pumps the charges which have previously been pumped to node Pi to earth potential VSS, transistor Ti operates in a pentode operation. However, the efficiency when transistor Ti pumps the charges by the pentode operation is lower than the efficiency when transistor Ti pumps the charges by the triode operation. On the other hand, the potential of node Pi decreases to the level of only VSS+VT because of the threshold voltage VT of transistor Ti. Therefore, the charges which are pumped from node Pi to potential VSS decrease by an amount of voltage VT, so that the charges which are pumped from the substrate to potential VSS are reduced. To avoid the decrease in charges which are pumped, the method whereby the gate of transistor Ti is pulled up is also used. However, in this case, the circuit construction becomes remarkably complicated.

(2) The second drawback relates to diode Di. When diode Di pumps the charges in the semiconductor substrate to node Pi, a number of minority carriers (electrons) are injected into the semiconductor substrate. The life time of the electrons is fairly long and when the potential of node Pi becomes an H level and the potential of the N+ layer in FIG. 1B becomes high, the injected planted electrons flow back into the N+ layer. Namely, the N+ layer of transistor Ti connected to node Pi operates in a manner similar to the guard ring and collects the electrons. This operation intends to again attract the electrons which were injected into the substrate. The efficiency (pumping efficiency) of the substrate voltage generator for pumping the charges in the substrate to potential VSS deteriorates remarkably. According to the experiments by the applicant, it has been found that the pumping efficiency was reduced to about $\frac{1}{4}$ as compared with the case where the electrons are not collected again. To maintain constant pumping performance, it is necessary to enlarge the dimensions of the whole circuit such as capacitor Ci, transistor Ti, oscillator 1, and the like.

In addition, there is the undesirable possibility that the injected electrons may exert an adverse influence on the operation of the electronic circuit formed on the semiconductor substrate. Practically speaking, in the case where the circuit formed on the semiconductor substrate is a dynamic memory, there is a potential for destroying the stored data. For example, it is now assumed that the positive charges are accumulated in the memory cell. These positive charges attract the injected electrons and are coupled with the electrons. The accumulated positive charges gradually decrease and the stored data is destroyed.

Similar disadvantages also occur when the conventional substrate voltage generator is formed on the N-type semiconductor substrate.

SUMMARY OF THE INVENTION

An object of the present invention is to provide a self substrate bias generator having a high efficiency and a high reliability.

To accomplish the above object, a self substrate bias generator according to the invention comprises:

- a semiconductor substrate (4) of a first conductivity type;
- means (1, 2) for supplying first and second signals having substantially the opposite phases;
- a first capacitor (C1) in which the first signal is supplied to one electrode and the other electrode is connected to a first node (P1);
- a second capacitor (C2) in which the second signal is supplied to one electrode and the other electrode is connected to a second node (P2);
- a well (3) of a second conductivity type formed on the semiconductor substrate (4); and
- first to fourth MOS transistors (T1, T2, TD1, TD2) formed in the well (3),
- wherein a current path of the first transistor (TD1) is connected between the substrate (4) and the first node (P1) and its gate is connected to the first node (P1),
- a current path of the second transistor (TD2) is connected between the substrate (4) and the second node (P2) and its gate is connected to the second node (P2),
- a current path of the third transistor (T1) is connected between a predetermined potential (VSS) and the first node (P1) and its gate is connected to the second node (P2), and a current path of the fourth transistor (T2) is connected between the predetermined potential (VSS) and the second node (P2) and the gate is connected to the first node (P1).

In the above construction, the first and second transistors (TD1, TD2) are used as what are called MOS diodes. The MOS diodes (TD1, TD2) don't inject the minority carriers into the semiconductor substrate (4) because of the first and second transistors formed in the well (3). The efficiency of pumping the charges from or to the semiconductor substrate is improved as compared with the conventional circuit. Further, the conventional circuit has a potential problem such that the electronic circuit formed on the substrate is adversely influenced by the minority carriers injected into the substrate, for example, a problem in that the data stored in the dynamic memory is destroyed. However, according to the circuit of the invention, these disadvantages are eliminated. On the other hand, the third and fourth transistors (T1, T2) operate in a triode operation and pump the charges from or to the first and second nodes to the predetermined potential. Therefore, according to the invention, the charge pumping efficiency is high. In addition, there is no need to provide a complicated circuit to remove the threshold barrier of the third and fourth transistor.

DETAILED DESCRIPTION OF THE PREFERRED EMBODIMENTS

A construction of a self substrate bias generator according to an embodiment of the present invention will now be described hereinbelow with reference to FIG. 2A. This embodiment relates to the self substrate bias generator using a P-type semiconductor substrate.

The output terminal of oscillator or clock generator 1 is connected to one electrode of capacitor C1 through a node Q1. The output terminal of clock generator 1 is also connected to the input terminal of inverter 2. The output terminal of inverter 2 is connected to one electrode of capacitor C2 through node Q2. An N-type well 3 is formed on the P-type semiconductor substrate. P-channel MOS transistors T1, T2, TD1, and TD2 are formed in well 3. One end of the current path of transistor TD1 and the gate thereof are connected to the other electrode of capacitor C1. The other end of the current path of transistor TD1 is connected to the semiconductor substrate (P-SUB). The other electrode of capacitor C2 is connected to one end of the current path of transistor TD2 and to the gate of transistor TD2. The other end of the current path of transistor TD2 is connected to the semiconductor substrate. One end of the current path of transistor T1 is connected to the node P1 of the other electrode of capacitor C1 and transistor TD1. The other end of the current path of transistor T1 is connected to the terminal to which earth potential VSS is supplied. The gate of transistor T1 is connected to a node P2 of the other electrode of capacitor C2 and transistor TD2. One end of the current path of transistor T2 is connected to node P2. The other end of the current path of transistor T2 is connected to the terminal to which earth potential VSS is supplied. The gate of transistor T2 is connected to node P1.

Figure 2A:
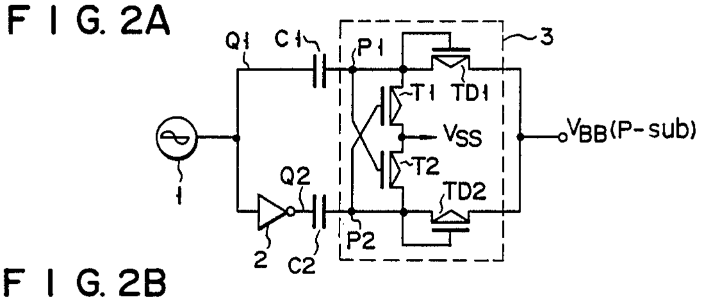
FIG. 2A is a circuit diagram showing a construction of a self substrate bias generator according to an embodiment of the invention.
Figure 2B:
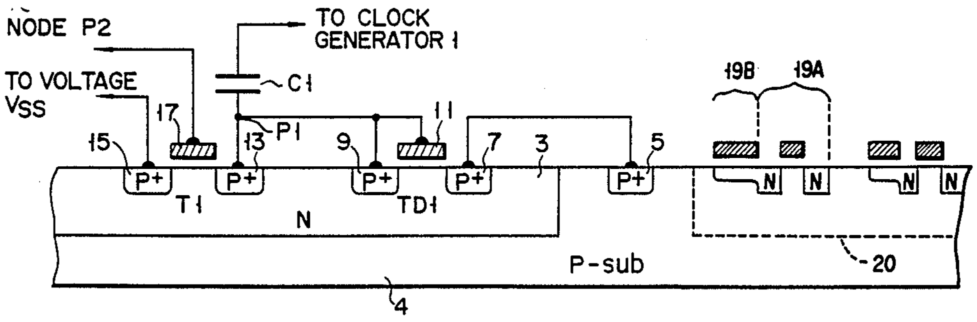
FIG. 2B is a cross sectional view for explaining a structure of a part of the self substrate bias generator shown in FIG. 2A.

FIG. 2B shows a practical construction in the case where the circuit shown in FIG. 2A is formed in the semiconductor substrate. FIG. 2B shows an example of a construction of the circuit shown in FIG. 2A on the side of transistors TD1 and T1 and capacitor C1. N-type well 3 is formed in a part of a P-type semiconductor substrate 4. P-channel MOS transistors T1 and TD1 are formed in well 3. An electrode take-out region 5 formed on semiconductor substrate 4 is connected to a P+ region 7 serving as a source to transistor TD1 by wiring. A P+ region 9 serving as a drain of transistor TD1 and the gate thereof are connected to a P+ region 13 serving as a source of transistor T1 and the other electrode of capacitor C1 through a node P1. A P+ region 15 serving as a drain of transistor T1 is connected to a terminal (not shown) to which earth potential VSS is applied. A gate 17 of transistor T1 is connected to node P2. An electronic circuit 19 (for example: dynamic memory cells) is formed in the other region of the P-type semiconductor substrate 4. In FIG. 2B, dynamic memory cells of a known structure are provided as circuit 19. Each memory cell comprises, for example, one MOS transistor 19A and one MOS capacitor 19B. (However, the structure of the memory cell is not limited to this alone.) The earth potential of this circuit is applied to P+ region 15.

Figure 3A:
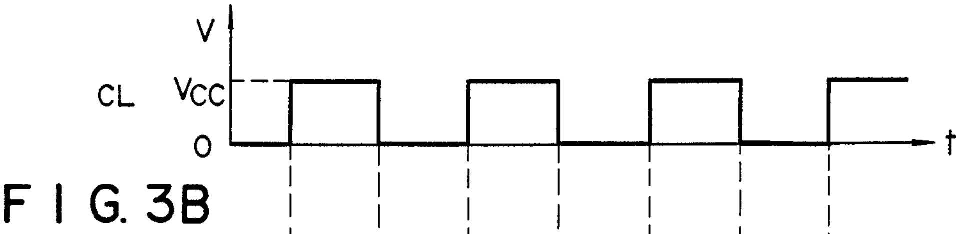
FIGS. 3A and 3B are time charts for explaining the operation of the circuit shown in FIG. 2A.
Figure 3B:
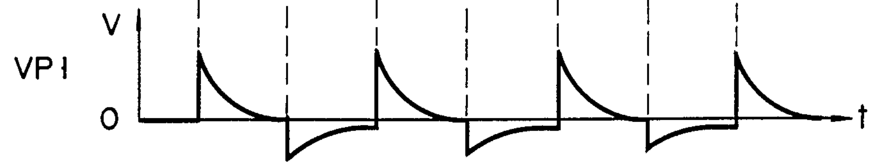

The operation of the circuit shown in FIGS. 2A and 2B will now be described with reference to FIGS. 3A and 3B. It is assumed that a clock signal CL as shown in FIG. 3A is output from oscillator 1. The H level of clock signal CL assumes voltage VCC and the L level assumes voltage VSS. The operations of transistors T1 and TD1 and capacitor C1 will be first described for easy understanding.

When the potential of clock CL becomes the L level while potential VCC is being applied to capacitor C1, the potential of node P1 becomes VSS-VCC, so that the potential of node P1 is lower than substrate potential VBB. Transistor TD1 is turned on and the charges in the semiconductor substrate flow through node P1. When transistor TD1 is on, the potential of node P2 is at the H level, and transistor T1 is off. Therefore, the potential of node P1 gradually increases. When a potential VP1 of node P1 is higher than $VBB-|VTP|$ (VBB is the potential of the semiconductor substrate and VTP is the threshold voltage of transistor TD1 (P-channel MOS transistor)), transistor TD1 is turned off and the inflow of the charges to node P1 is stopped. Next, when the potential of clock signal CL becomes the H level, potential VP1 of node P1 also becomes the H level and transistor TD1 is turned off. On the contrary, the potential of node P2 becomes the L level and transistor T1 is turned on. The charges accumulated in node P1 (namely, the charges pumped from the substrate to node P1 for the period of time when the potential of clock signal CL is at the L level) flow through transistor T1 to the terminal which was applied with potential VSS.

The potential of node P1 gradually decreases. Since transistor T1 operates in a triode operation, potential VP1 of node P1 is reduced to earth potential VSS. Next, when the potential of clock signal CL becomes the L level, the potential of node P1 decreases to VSS-VCC. Thereafter, similar operations are repeated.

Operations similar to the above are also executed with respect to transistors T2 and TD2. A signal having a phase which is substantially opposite to that of clock signal CL is applied to node Q2 by inverter 2. Namely, when the output signal of inverter 2 becomes the L level, the potential of node P2 decreases to below earth potential VSS, because node P2 is capacitively coupled with inverter 2. The charges in the semiconductor substrate are pumped to node P2. When the output signal of inverter 2 becomes the H level, the potential of node P2 increases. At this time, the potential of node P1 is at the L level and transistor T2 is turned on, so that the charges which have been pumped to node P2 are pumped to potential VSS.

By repeating the foregoing operations, the charges in the semiconductor substrate are pumped and potential VBB of semiconductor substrate is maintained to below earth potential VSS (namely, $-VCC+|VTP|$).

Figure 1A:
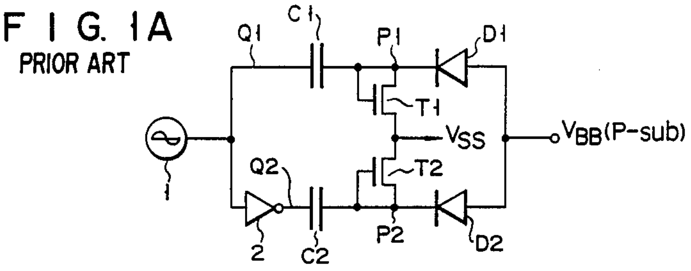
F I G. 1A PRIOR ART
FIGS. 1A and 1B are diagrams showing a structure of a conventional self substrate bias generator.
Figure 1B:
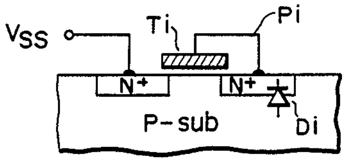
F I G. 1B PRIOR ART

Transistors TD1 and TD2 are used as so-called MOS diodes and correspond to diodes D1 and D2 in FIG. 1A. Since diodes D1 and D2 are the diodes formed on the P-type substrate, the minority carriers are injected into the substrate. Hitherto, there is a drawback because the injected electrons flow back into nodes P1 and P2 and the pumping efficiency deteriorates. On the other hand, since MOS diodes TD1 and TD2 are the P-channel transistors formed in N-well 3, no minority carriers are injected into the substrate. Therefore, the charges don't flow back into the substrate and the pumping efficiency is improved according to the embodiment. The conventional prior art circuit has a problem in that an adverse influence is exerted on the electronic circuit 19 by the electrons injected into the substrate. For example, there is the earlier described problem that the data stored in the dynamic memory is destroyed. However, using to the circuit of the embodiment shown, such drawbacks are completely eliminated.

In the embodiment shown, when the charges are pumped from node Pi (i=1 or 2) to earth potential VSS through transistor Ti, transistor Ti functions in a triode operation. This is because the base, collector, and emitter of transistor Ti are individually constructed, transistors T1 and T2 are cross-coupled, and a potential below the earth potential is applied to the gates of those transistors. Since transistor Ti operates as a triode, the efficiency to pump the charges from node P1 to potential VSS is improved as compared with that of the conventional circuit. Further, the potential of node P2 decreases to earth potential VSS because of the triode operation of transistor Ti. This point is typical when considering that the potentials of nodes P1 and P2 decrease to only VSS+VT in FIG. 1A. The charges which have been pumped to node Pi can be completely pumped to potential VSS. From this viewpoint, it will be appreciated that the substrate voltage generator according to the embodiment has an excellent pumping performance when pumping the charges in the semiconductor substrate by an amount of voltage VT as compared with the conventional circuit. In addition, there is no need to provide a complicated circuit to remove potential barrier VT.

Figure 4A:
FIGS. 4A and 4B are time charts for explaining the improved operation of the circuit shown in FIG. 2A.
Figure 4B:
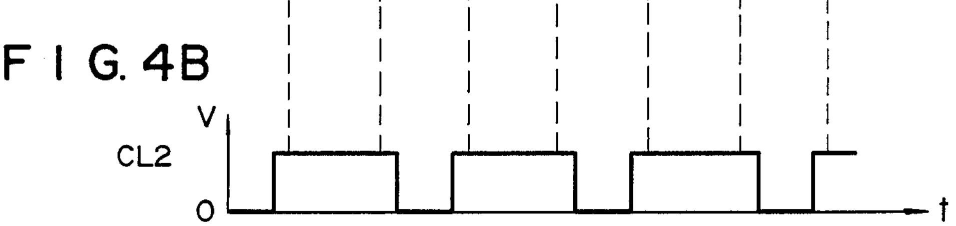

In the embodiment, there is a potential problem that transistors T1 and T2 may be simultaneously turned on and the efficiency of the substrate voltage generator deteriorates. It is assumed that the potential of node P1 has changed to the L level for explanation. After the potential of node P1 becames the L level, the potential of node P2 is also maintained at the L level for the period of the delay time of inverter 2, so that transistor T1 is held on. At this time, the potential of node P1 is below potential VSS. Therefore, there is the risk that charges may flow from potential VSS to node P1. In this case, the efficiency of the operation of the substrate bias generator noticeably deteriorates. To avoid this situation, it is desirable for clock signals CL1 and CL2 to be applied to nodes Q1 and Q2 to have substantially the opposite phases, as shown in FIGS. 4A and 4B. Namely, the period of time when the potential (CL1) of node Q1 is at the L level ends for the period of time when the potential (CL2) of node Q2 is at the H level, the period of time when the potential of node Q2 is at the L level ends for the period of time when the potential of node Q1 is at the H level, and at the same time the phases of clock signals CL1 and CL2 are opposite. When the clock signals having substantially the opposite phases are supplied to node Q1 and Q2, transistor Ti (i=1 or 2) is turned off and thereafter, the potential of node Pi decreases to below potential VSS. Therefore, it is possible to prevent the above discussed disadvantage and to improve the efficiency of the circuit.

Figure 5:
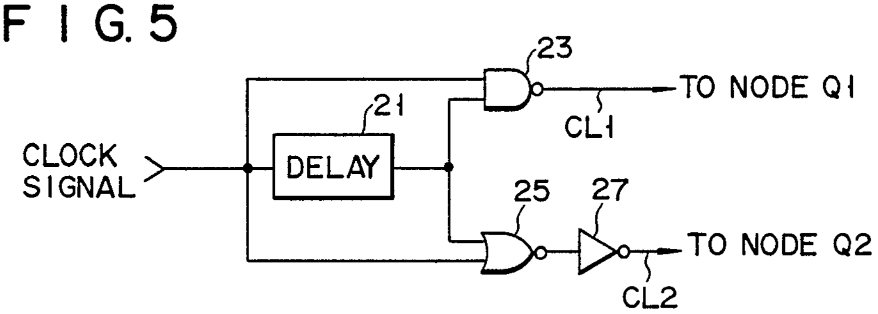
FIG. 5 is a circuit diagram for supplying the signals shown in FIGS. 4A and 4B.

To obtain signals as shown in FIGS. 4A and 4B, it is sufficient to us3 the circuit of a construction as shown in, e.g., FIG. 5. Namely, clock signal CL from oscillator 1 is input to a delay circuit 21, to one input terminal of a NAND gate 23, and to one input terminal of a NOR gate 25. The output signal of delay circuit 21 is input to the other input terminals of NAND gate 23 and of NOR gate 25. The output of NOR gate 25 is input to an inverter 27. The output terminal of inverter 27 is connected to node Q2. The output terminal of the NAND gate 23 is connected to node Q1.

In the foregoing embodiments, clock signals having substantially opposite phases were applied to nodes P1 and P2 using one oscillator 1. The circuit to supply the clock signals is not limited to that shown in the embodiments. Any construction which can supply signals of substantially opposite phases (including the case where the phases are completely opposite) may be also used.

An example using a P-type semiconductor substrate was used in the described embodiments. This invention is not limited to this example. The invention may also use a N-type semiconductor substrate. In tht case, the self substrate bias generator pumps the charges from the power source voltage (VCC) into the semiconductor substrate, thereby maintaining the potential of the semiconductor substrate to a potential above the power source potential. In that case, a P-type well region is formed on the N-type semiconductor substrate. N-channel transistors are formed in this well region. Power source voltage (VCC) is applied to one end of each current path of transistors T1 and T2. The other circuit's construction are the same as those of the circuits shown in FIG. 2A. In this case, in handling signals CL1 and CL2 shown in FIGS. 4A and 4B, it is sufficient to reverse the logic levels of these signals. Such reversed signals may be obtained and used by inverting the output signals of the circuit shown in FIG. 5.

What is claimed is:

1. A self substrate bias generator comprising:

a semiconductor substrate of a first conductivity type;

means for supplying first and second signals having substantially opposite phases;

a first capacitor in which said first signal is supplied to one electrode and the other electrode is connected to a first node;

a second capacitor in which said second signal is supplied to one electrode and the other electrode is connected to a second node;

a well of a second conductivity type formed in said semiconductor substrate; and first to fourth MOS transistors formed in said well, wherein a current path of said first MOS transistor is connected between the substrate and said first node and its gate is connected to the first node, a current path of said second MOS transistor is connected between the substrate and said second node and its gate is connected to the second node, a current path of said third MOS transistor is connected between a predetermined potential and said first node and its gate is connected to the second node, and a current path of said fourth MOS transistor is connected between said predetermined potential and said second node and its gate is connected to the first node.

2. A self substrate bias generator according to claim 1, wherein said semiconductor substrate is a P-type semiconductor substrate, and said self substrate bias generator is a circuit for pumping the charges in the semiconductor substrate to said predetermined potential and maintaining the potential of the semiconductor substrate to a potential below said predetermined potential.

3. A self substrate bias generator according to claim 2, wherein an electronic circuit is formed in the portion other than the portion of said semiconductor substrate where said self substrate bias generator is formed, and said predetermined potential is substantially the same as the earth potential to be applied to said electronic circuit.

4. A self substrate bias generator according to claim 1, wherein said means for supplying said first and second signals is means for supplying clock signals such as to set a potential of the first node to an L level after the third transistor is turned off and to set a potential of the second node to an L level after the fourth transistor is turned off.

5. A self substrate bias generator according to claim 4, wherein the means for supplying said first and second signals comprises:

means for supplying a third clock signal;

delay means for delaying said third clock signal;

means for receiving said third clock signal and a delay signal from said delay means, for generating the NAND of said third clock signal and said delay signal, and for outputting this NAND as said first signal; and means for receiving said first signal and said delay signal, generating the OR of the third signal and the delay signal, and for outputting this OR as said second signal.

6. A self substrate bias generator according to claim 1, wherein said semiconductor substrate is an N-type semiconductor substrate, and said self substrate bias generator is a circuit for pumping the charges from said predetermined potential into said semiconductor substrate and for maintaining the potential of the semiconductor substrate to a potential above said predetermined potential.

7. A self substrate bias generator according to claim 6, wherein an electronic circuit is formed in the portion other than the portion of said semiconductor substrate where said self substrate bias generator is formed, and said predetermined potential is substantially the same as the power source potential to be applied to said electronic circuit.

8. A self substrate bias generator according to claim 6, wherein the means for supplying said first and second signals is means for supplying clock signals so as to set a potential of said first node to an H level after said third transistor is turned off and to set a potential of said second node to an H level after said fourth transistor is turned off.

9. A self substrate bias generator according to claim 8, wherein the means for supplying said first and second clock signals comprises:

means for supplying a third clock signal;

delay means for delaying said third clock signal;

means for receiving said third clock signal and a delay signal from said delay means, for generating the AND of said third clock signal and said delay signal, and for outputting this AND as said first signal; and means for receiving said first signal and said delay signal, for generating the NOR of the third signal and the delay signal, and for outputting this NOR as said second signal.

10. A self substrate bias generator according to claim 2, wherein said first and second signals are first and second clock signals, respectively, said first clock signal changes in level from H level to L level after the level of said second clock signal changes from L level to H level, and said second clock signal changes in level from H level to L level after the level of said first clock signal changes from L level to H level.

11. A self substrate bias generator according to claim 6, wherein said first and second signals are first and second clock signals, respectively, said second clock signal changes in level from H level to L level after the level of said first clock signal changes from L level to H level, and said first clock signal changes in level from H level to L level after the level of said second clock signal changes from L level to H level.

* * * * *